United States Patent
Nakao et al.

(10) Patent No.: US 9,252,038 B2
(45) Date of Patent: Feb. 2, 2016

(54) DRIVE DEVICE AND CONVEYANCE DEVICE

(75) Inventors: Hirotoshi Nakao, Kanagawa (JP);
Muneyoshi Nishitsuji, Kanagawa (JP);
Takahiro Yoshino, Kanagawa (JP);
Takuya Kuriyama, Kanagawa (JP);
Taiji Chiba, Kanagawa (JP); Daisuke Kawakubo, Kanagawa (JP); Kiyotaka Yamada, Kanagawa (JP)

(73) Assignee: Ulvac, Inc., Kanagawa (JP)

( * ) Notice: Subject to any disclaimer, the term of this patent is extended or adjusted under 35 U.S.C. 154(b) by 597 days.

(21) Appl. No.: 13/519,232

(22) PCT Filed: Dec. 22, 2010

(86) PCT No.: PCT/JP2010/007446
§ 371 (c)(1),
(2), (4) Date: Jun. 26, 2012

(87) PCT Pub. No.: WO2011/080897
PCT Pub. Date: Jul. 7, 2011

(65) Prior Publication Data
US 2012/0293026 A1 Nov. 22, 2012

(30) Foreign Application Priority Data
Dec. 28, 2009 (JP) .................. 2009-297918

(51) Int. Cl.
*B25J 9/04* (2006.01)
*H01L 21/677* (2006.01)
*B25J 9/10* (2006.01)
*B25J 9/00* (2006.01)

(52) U.S. Cl.
CPC .......... *H01L 21/67742* (2013.01); *B25J 9/043* (2013.01); *B25J 9/1065* (2013.01); *B25J 9/003* (2013.01)

(58) Field of Classification Search
CPC ............. B25J 9/04; B25J 9/041; B25J 9/042; B25J 9/102; B25J 9/1055; B25J 9/106; B25J 9/1065; B25J 9/12; B25J 9/123; B25J 9/126; B25J 9/14; B25J 9/142; B25J 9/146; B25J 11/0095; B25J 15/0014; B25J 15/0019; B25J 17/0241; B25J 17/025; B25J 17/0258; B25J 17/0266; B25J 18/007; B25J 18/02; F16H 1/02; F16H 1/04; F16H 1/06; H01L 21/67; H01L 21/677; H01L 21/67703; H01L 21/67739; H01L 21/67742; H01L 21/67748; H01L 21/67766; H01L 2221/67; H01L 2221/677; H01L 2221/67703; H01L 2221/67739; H01L 2221/67742; H01L 2221/67748; H01L 2221/67766; Y10S 414/13; Y10S 901/15; Y10S 901/16; Y10S 901/17; Y10S 901/23
USPC ................. 310/80; 414/226.05, 744.1, 744.2, 414/744.3, 744.5, 917
See application file for complete search history.

(56) References Cited

U.S. PATENT DOCUMENTS

| | | | | |
|---|---|---|---|---|
| 4,984,959 | A | * | 1/1991 | Kato .......................... 414/744.3 |
| 5,151,008 | A | * | 9/1992 | Ishida et al. ............... 414/744.5 |
| 5,851,296 | A | * | 12/1998 | Haraguchi et al. ............ 118/719 |
| 5,950,495 | A | * | 9/1999 | Ogawa et al. .............. 74/490.01 |
| 5,975,834 | A | * | 11/1999 | Ogawa et al. .............. 414/744.5 |
| 5,993,142 | A | * | 11/1999 | Genov et al. ............... 414/744.5 |
| 6,102,649 | A | * | 8/2000 | Ogawa et al. .............. 414/744.5 |
| 6,109,860 | A | * | 8/2000 | Ogawa et al. .............. 414/744.5 |
| RE37,731 | E | * | 6/2002 | Ogawa et al. .............. 74/490.01 |
| 8,366,375 | B2 | * | 2/2013 | Musha et al. .............. 414/744.5 |
| 2003/0029663 | A1 | | 2/2003 | Etou |

FOREIGN PATENT DOCUMENTS

| | | |
|---|---|---|
| JP | 63-315387 A | 12/1988 |
| JP | 06-128982 A | 5/1994 |
| JP | 10-249757 A | 9/1998 |
| JP | 2000-195923 A | 7/2000 |
| JP | 2003-054482 A | 2/2003 |
| JP | 2007-118171 A | 5/2007 |
| JP | 2007-246357 A | 9/2007 |

| JP | 2008-135630 A | 6/2008 |
| JP | 2008-235494 A | 10/2008 |
| WO | WO-2007/008797 A1 | 1/2007 |

OTHER PUBLICATIONS

European Search Report in European Application No. 10840757.8, dated Sep. 22, 2014.
International Search Report in International Application No. PCT/JP2010/007446, filed Dec. 22, 2010.

\* cited by examiner

*Primary Examiner* — Ernesto Suarez

*Assistant Examiner* — Brendan Tighe

(74) *Attorney, Agent, or Firm* — Saliwanchik, Lloyd & Eisenschenk

(57) ABSTRACT

To provide a drive device rigid enough to endure a stress due to a reaction during driving of an arm unit, and to provide a conveyance device including the same.

A drive device includes a frame and an actuator installed in the frame. The frame is formed by integral molding by casting. The frame includes a connecting portion connectable to a division wall of a conveyance chamber, a bottom plate portion serving as an opposed portion provided to be opposed to the connecting portion, and a plurality of coupling portions that couple the connecting portion and the bottom plate portion to each other. The actuator includes three coaxial shafts (two rotating shafts and single turning shaft), three motors, and a transmission mechanism that transmits a rotational driving force by the three motors to the three shafts. The frame is formed by the integral molding, and hence it is possible to realize a drive device having a high rigidity.

9 Claims, 17 Drawing Sheets

DRIVE DEVICE AND CONVEYANCE DEVICE

CROSS-REFERENCE TO RELATED APPLICATIONS

This application is the U.S. national stage application of International Patent Application No. PCT/JP2010/007446, filed Dec. 22, 2010, which claims priority to Japanese Application No. 2009-297918, filed Dec. 28, 2009, the disclosures of each of which are incorporated herein by reference in their entirety.

TECHNICAL FIELD

The present invention relates to a conveyance device that conveys a semi-conductor substrate, a glass substrate, and the like, and to a drive device to be used in the same.

BACKGROUND ART

In the semi-conductor manufacturing field and the like, there is conveyance devices each including multijoint arms as a conveyance means for conveying a conveyance object such as a wafer or glass substrate under vacuum or in a process gas atmosphere, for example. Extending and retracting or turning the arm, such a conveyance device moves a distal end of the arm to an arbitrary position and conveys the conveyance object. Some arms allow three-dimensional movement by extending and retracting or turning in a horizontal direction with a rotational power in the horizontal direction and moving up and down in a vertical direction. In this case, a drive portion that drives the arm needs a mechanism for generating the rotational power in the horizontal direction and a mechanism for moving up and down in the vertical direction.

For example, Patent Document 1 describes a conveyance device including a casing that houses main parts of a drive portion and a drive-portion support frame housed in the casing. The drive-portion support frame supports a plurality of motors and the like for extending/retracting and turning arms and the like. The drive-portion support frame moves up and down within the casing along linear guide rails provided in the vertical direction via a ball screw mechanism by the motors provided at the bottom portion of the casing. When the drive-portion support frame moves up and down, all the arms move up and down (for example, see paragraph [0016] and FIG. 1 of Patent Document 1).

To the upper portion of the casing, a base plate is connected. The base plate is provided in an opening portion formed in a scaffold (fixing portion) in the vacuum atmosphere. That is, the drive portion is supported by the base plate such that (the drive portion of) the conveyance device is hung from the opening portion formed in the scaffold.

CITED DOCUMENT

Patent Document

Patent Document 1: Japanese Patent Application Laid-open No. 2008-135630

DISCLOSURE OF THE INVENTION

Problem to be solved by the Invention

In the conveyance device as described above, during driving of the arm, a force added from the drive portion to the arm is added to the drive-portion support frame and the casing as a reaction. Therefore, a stress generates in the drive-portion support frame and the casing. In particular, during driving of the arm to turn, the casing receives a rotational force about an axis in the vertical direction and a shear stress generates in the portion connected to the base plate. Consequently, there is a fear that the connected portion of the casing may have a distortion or may be damaged.

In view of the above-mentioned circumstances, it is an object of the present invention to provide a drive device rigid enough to endure a stress due to a reaction during driving of an arm unit, and to provide a conveyance device including the same.

Means for Solving the Problem

In order to achieve the above-mentioned object, a drive device according to an embodiment of the present invention is a drive device that drives a conveyance body and includes an actuator and a frame, the conveyance body being provided within a chamber including a division wall and capable of conveying a conveyance object.

The actuator drives the conveyance body.

The frame is formed by integral molding, is connected to the division wall of the chamber, and installs the actuator.

A conveyance device according to an embodiment of the present invention includes a conveyance body, an actuator, and a frame.

The conveyance body is provided in a chamber including a division wall and is capable of conveying a conveyance object.

The actuator drives the conveyance body.

The frame is formed by integral molding, is connected to the division wall of the chamber, and installs the actuator.

BEST MODE(S) FOR CARRYING OUT THE INVENTION

Figure 1:
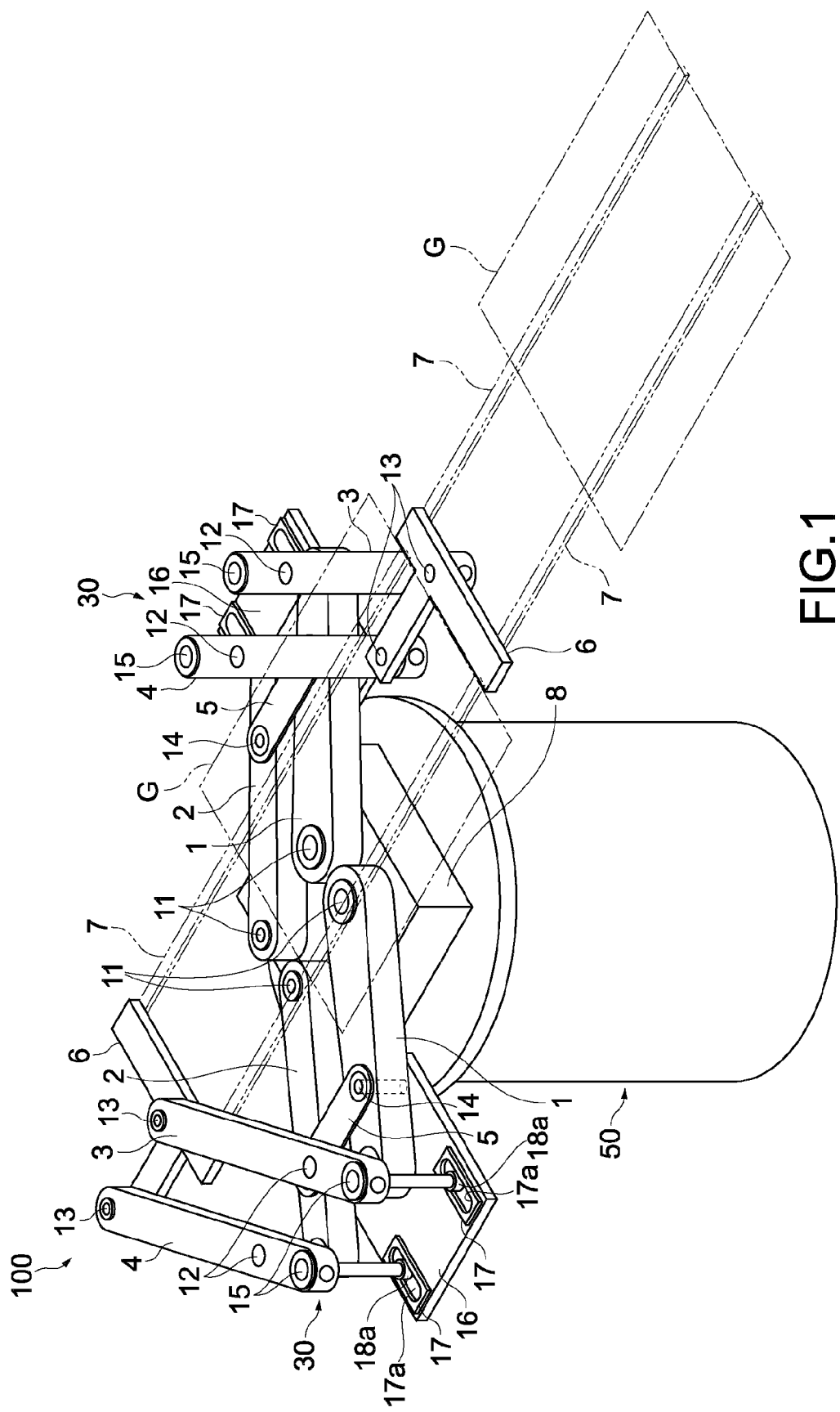
FIG. 1 A perspective view showing a conveyance device according to a first embodiment of the present invention.

A drive device according to an embodiment is a drive device that drives a conveyance body and includes an actuator and a frame, the conveyance body being provided within a chamber including a division wall and capable of conveying a conveyance object.

The actuator drives the conveyance body.

The frame is formed by integral molding, is connected to the division wall of the chamber, and installs the actuator.

The frame is formed by integral molding, and hence it is possible to enhance the rigidity and durability of the frame. A part of the frame is connected to the division wall, and hence even if a stress due to a reaction when the actuator drives the conveyance body is added to the frame, it is possible to reliably prevent damages and the like of the frame.

The actuator may include a turn shaft, a motor, and a support base.

The turn shaft is connected to the conveyance body and turns the conveyance body.

The motor provides the turn shaft with a rotational driving force.

The support base supports the turn shaft and the motor.

In other words, in the actuator, the turning shaft and the motor are integrated by the support base. Thus, by a user assembling the thus integrated actuator to the frame, it is possible to easily assemble the drive unit of the conveyance device. The drive device includes the actuator and the frame.

The conveyance body may be a multijoint-type arm unit. In this case, the actuator further includes an extension and retraction shaft for extending and retracting an arm of the arm unit.

The frame may include a connecting portion, an opposed portion, and a coupling portion.

The connecting portion is connected to the division wall.

The opposed portion is provided to be opposed to the connecting portion.

The coupling portion couples the connecting portion and the opposed portion to each other such that the support base is provided between the connecting portion and the opposed portion.

With this configuration, the user is able to assemble the thus integrated actuator to the frame in such a manner that the actuator is inserted from a side of the connecting portion or a side of the opposed portion into the frame.

The actuator may further include a raising and lowering mechanism that raises and lowers the support base between the connecting portion and the opposed portion. When the raising and lowering mechanism drives the support base to move up and down, the conveyance body is capable of moving up and down.

The connecting portion or the opposed portion may include a cutout portion, and the raising and lowering mechanism may include a raising and lowering drive source unit provided to the cutout portion. By providing the raising and lowering drive source unit to the cutout portion, it is possible to realize downsizing of the drive unit.

The conveyance body may be a multijoint-type arm unit and include a plurality of conveyance bodies.

In this case, the actuator only needs to include a first rotating shaft, a second rotating shaft, a turning shaft, and a motor.

The first rotating shaft is connected to a first arm unit of the plurality of arm units and extends and retracts an arm of the first arm unit.

The second rotating shaft is connected to a second arm unit of the plurality of arm units and extends and retracts an arm of the second arm unit.

The turning shaft integrally turns the first arm unit and the second arm unit.

The motors each drive the first rotating shaft, the second rotating shaft, and the turning shaft.

The motors may be arranged at equiangular intervals along a direction in which the first arm unit and the second arm unit turn. Thus, it is possible to evenly distribute a stress added to the frame and the like via the motors.

The actuator may further include a raising and lowering motor and a plurality of guide shafts.

The raising and lowering motor raises and lowers the support base along a direction in which the shaft extends.

The plurality of guide shafts are arranged at equiangular intervals along a direction in which the shaft rotates to guide raising and lowering operations of the support base by the raising and lowering motor.

Thus, it is possible to evenly distribute a stress added to the guide shafts and a stress added to the frame via the guide shafts especially when the conveyance body turns.

The coupling portion may include a plurality of coupling portions arranged at equiangular intervals in a circumference with the turn shaft being a center. Thus, it is possible to evenly distribute a stress added to the coupling portion and the connecting portion especially when the conveyance body turns.

The conveyance body may be a single multijoint-type arm unit.

In this case, the actuator includes a rotating shaft, a turning shaft, and motors.

The rotating shaft is connected to the arm unit and extends and retracts an arm of the arm unit.

The turning shaft turns the arm unit.

The motors each drive the rotating shaft and the turning shaft.

A conveyance device according to an embodiment of the present invention includes a conveyance body, an actuator, and a frame.

The conveyance body is provided in a chamber including a division wall and is capable of conveying a conveyance object.

The actuator drives the conveyance body.

The frame is formed by integral molding, is connected to the division wall of the chamber, and installs the actuator.

Hereinafter, embodiments of the present invention will be described with reference to the drawings.

<First Embodiment>

FIG. 1 is a perspective view showing a conveyance device according to an embodiment of the present invention.

A conveyance device 100 conveys a substrate G being a conveyance object between chambers for processing under vacuum, for example. The examples of the substrate G include a glass substrate provided to a display device. The conveyance device 100 includes two arm units 30 and a drive unit 50 (drive device). The arm units 30 are provided to the upper portion of the conveyance device 100 and each serve as a conveyance body. The drive unit 50 is connected to the arm units 30 beneath the arm units 30 and drives the arm units 30.

Each of the two arm units 30 includes a first arm 1, a second arm 2, a third arm 3, a fourth arm 4, a link member 5, a hand base 6, and a hand member 7. Further, the two arm units 30 include a common turning block 8. The two arm units 30 are capable of extending and retracting independently of each other. Further, the turning block 8 is turned by a single turning shaft 73 driven by the drive unit 50, which will be described later. When the turning block 8 turns, the two arm units 30 integrally turn. The two arm units 30 have substantially the same structure. Hereinafter, therefore, the structure of one of the arm units 30 will be described.

The first arm 1 and the second arm 2 constitute a parallel link and the third arm 3 and the fourth arm 4 constitute another parallel link. At one end of each of the first arm 1 and the second arm 2, a first joint shaft 11 is connected to the drive unit 50 via the turning block 8. As will be described later, the first joint shafts 11 are connected via the turning block 8 to a single common shaft 71 (or 72) (see FIG. 8) provided to the drive unit 50. When the single shaft 71 (or 72) is driven to rotate in the drive unit 50, one of the arm units 30 extends or retracts.

The other end of each of the first arm 1 and the second arm 2 is provided with a second joint shaft 12. One end of each of the third arm 3 and the fourth arm 4 is provided with a guide shaft 15. The guide shaft 15 is connected to a guide plate 16 as will be described later. To the other end of each of the third arm 3 and the fourth arm 4, the hand base 6 is connected via the third joint shaft 13, the hand base 6 having a T-like plate shape. The hand base 6 is provided with the hand member 7 including two long members, for example. Thereby, the substrate G is disposed on the hand member 7. The hand member 7 is provided with a mechanism (not shown) for supporting the substrate G using vacuum adsorption, for example.

Between the guide shafts 15 and the third joint shafts 13 of the third arm 3 and the fourth arm 4, on a side closer to the guide shafts 15 than the third joint shafts 13, the second joint shafts 12 described above are connected. Via the second joint shafts 12, the first arm 1 and the second arm 2 are connected to the third arm 3 and the fourth arm 4, respectively.

Between the first joint shafts 11 and the second joint shafts 12 of the first arm 1 and the second arm 2, on a side closer to the second joint shafts 12 than the first joint shafts 11, the link member 5 is connected to the first arm 1 and the second arm 2 via link shafts 14. The link member 5 assists the function of the parallel link of the first arm 1 and the second arm 2.

To end portions of the guide shafts 15, which is on an opposite side of a side on which the third arm 3 and the fourth arm 4 are connected thereto, bearing rollers 18 are connected. Each of the bearing rollers 18 is engaged to a cam groove 17a formed to have a long-hole shape in a cam plate 17 attached to the guide plate 16. Thereby, with driving of the arm unit 30 to extend or retract, the bearing rollers 18 slide within the cam grooves 17a. Further, the guide plate 16 is connected to the first arm 1 and the second arm 2 via the link shafts 14 described above.

When the arm unit 30 is driven so that the third arm 3 and the fourth arm 4 form an angle of substantially 0° with respect to the first arm 1 and the second arm 2, respectively, that is, when the arm unit 30 is folded to have a minimum footprint, the bearing roller 18 is, within each cam groove 17a, positioned at an end portion of the cam groove 17a on a side away from center shafts (three coaxial shafts 75) of the drive unit 50.

In contrast, when the arm unit 30 is driven so that the third arm 3 and the fourth arm 4 form a maximum angle with respect to the first arm 1 and the second arm 2, respectively, the bearing roller 18 is, within each cam groove 17a, positioned at an end portion of the cam groove 17a on a side closer to the three coaxial shafts 75 of the drive unit 50.

Upon the driving of the arm unit 30 to extend or retract, the hand member 7, the hand base 6, the guide plate 16, and the link member 5 move without changing their own orientation.

Such that the third arm 3 and the fourth arm of the one arm unit 30 are different in height from the third arm 3 and the fourth arm 4 of the other arm unit 30, the lengths of the guide shaft 15 and the second joint shaft 12 are set. Thus, both the arm units 30 are capable of extending and retracting without interferences.

Each of the one ends of the third arm 3 and the fourth arm 4 is free to move in one direction and guided in the one direction by the guide shaft 15 and the cam plate. The one direction means a direction orthogonal to a direction in which the arm unit 30 extends and retracts.

In other words, a guide mechanism 10 acts to limit the movement of an end portion of a second parallel link mechanism 32 in a Y-axis direction. Thus, it is possible to control the operation of a retaining portion 67, which is the acting end of the second parallel link mechanism 32, and its positioning with high accurate. Further, with the guide mechanism 10, it is possible to achieve downsizing of the arm unit 30. At the same time, even when the substrate G having a large size is conveyed, it is possible to ensure an operating range of the arm unit 30 corresponding to a desired occupied footprint of the large substrate G.

Figure 2:
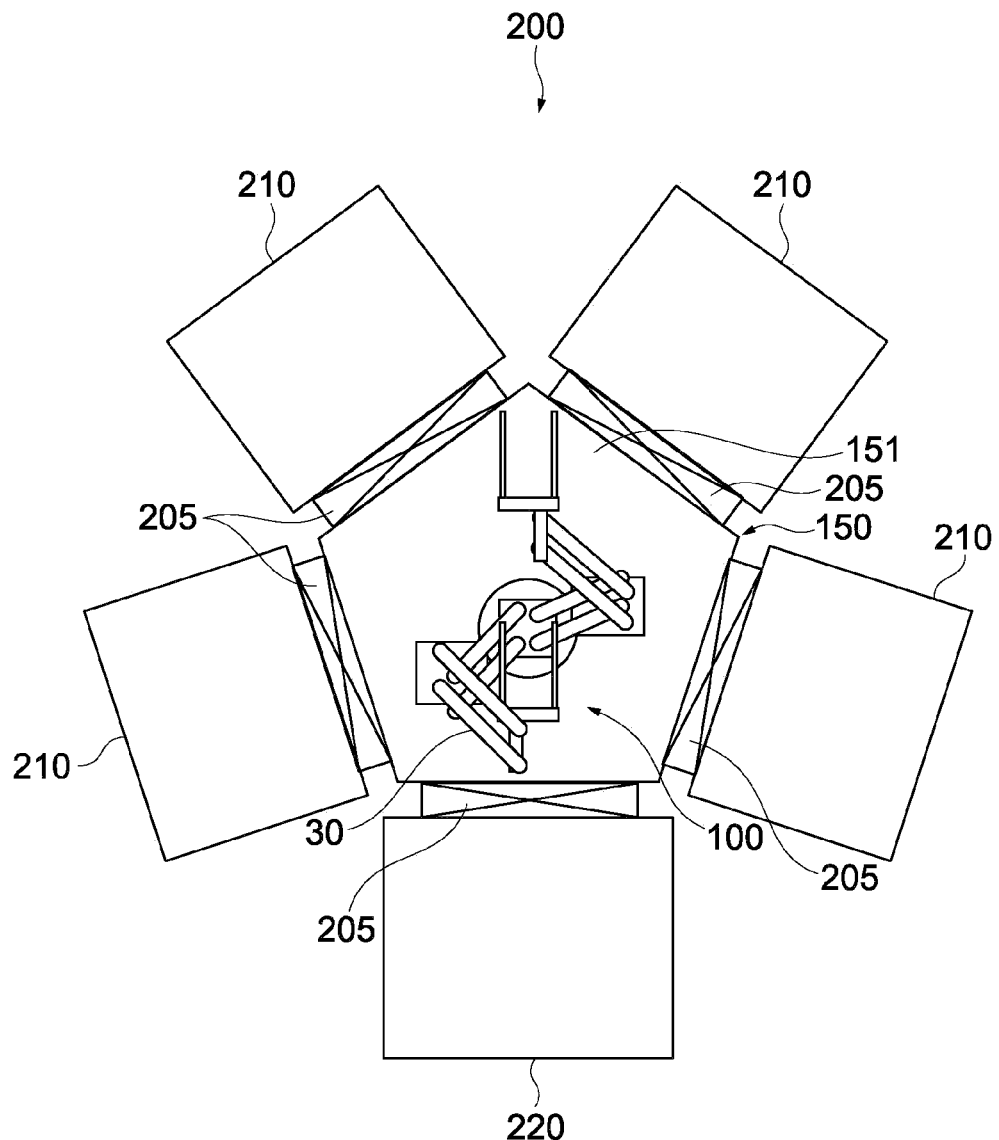
FIG. 2 A plan view schematically showing a cluster type vacuum processing apparatus to which the conveyance device according to the first embodiment is applied.

FIG. 2 is a plan view showing a cluster type vacuum processing apparatus to which the conveyance device 100 according to this embodiment is applied, for example. This vacuum processing apparatus 200 includes a plurality of vacuum processing units 210, a load-lock unit 220, and a conveyance unit 150. The conveyance unit 150 is connected to the vacuum processing units 210 and the load-lock unit 220 via respective gates 205. The vacuum processing units 210 are units for performing, for example, PVD (Physical Vapor Deposition), CVD (Chemical Vapor Deposition), or other vacuum processing.

The conveyance unit 150 includes a conveyance chamber 151 capable of maintaining a vacuum state, for example. The arm units 30 of the conveyance device 100 are provided within the conveyance chamber 151. As will be described later, the drive unit 50 of the conveyance device 100 is provided outside the conveyance chamber 151. The conveyance device 100 is capable of accessing the load-lock unit 220 and the vacuum processing units 210 and conveying the substrate G thereto/therefrom.

The apparatus to which the conveyance device 100 is applied is not limited to the cluster type one described above and the conveyance device 100 is applicable to various vacuum processing apparatuses 200.

Figure 3:
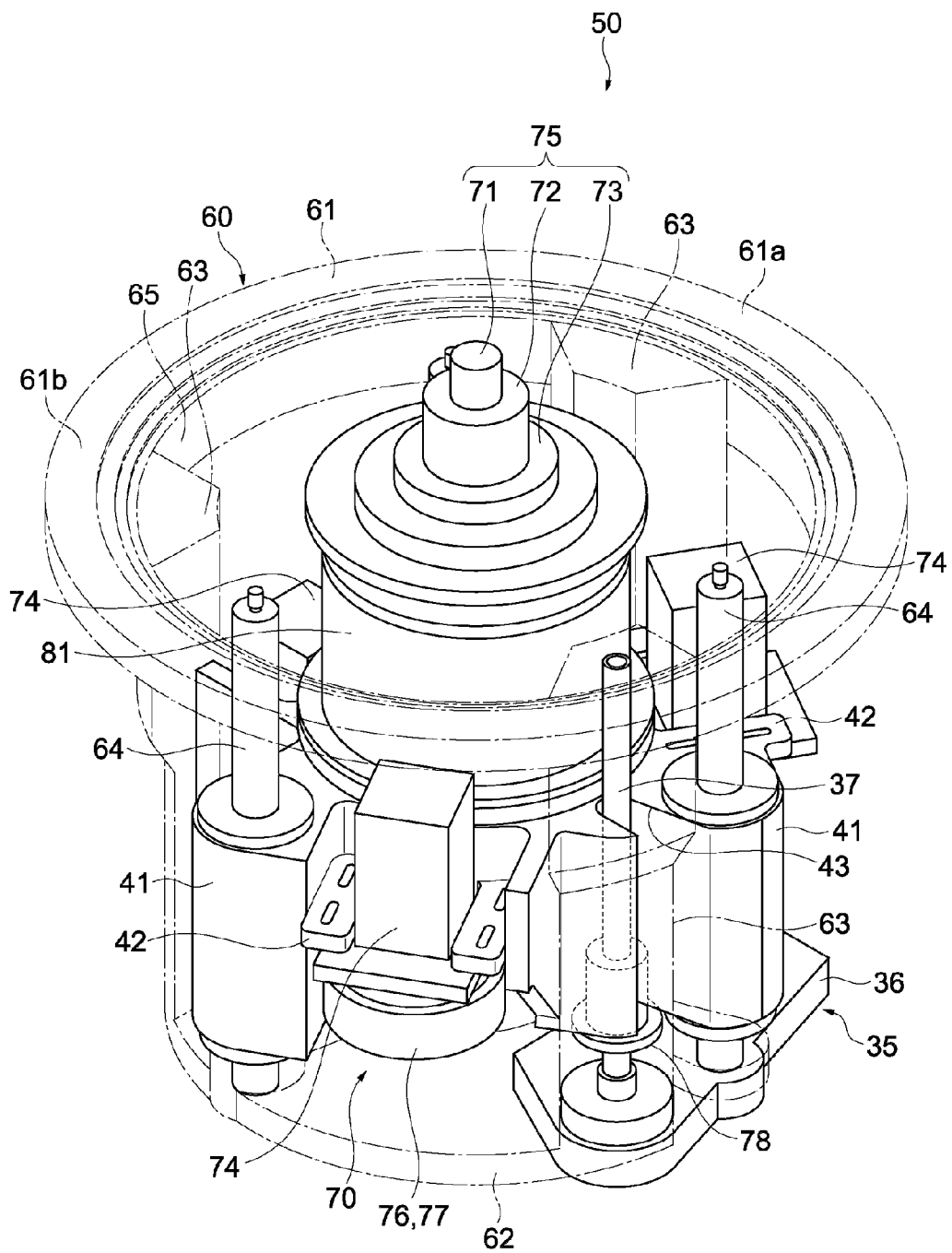
FIG. 3 A perspective view showing a drive unit of the conveyance device according to the first embodiment.
Figure 4:
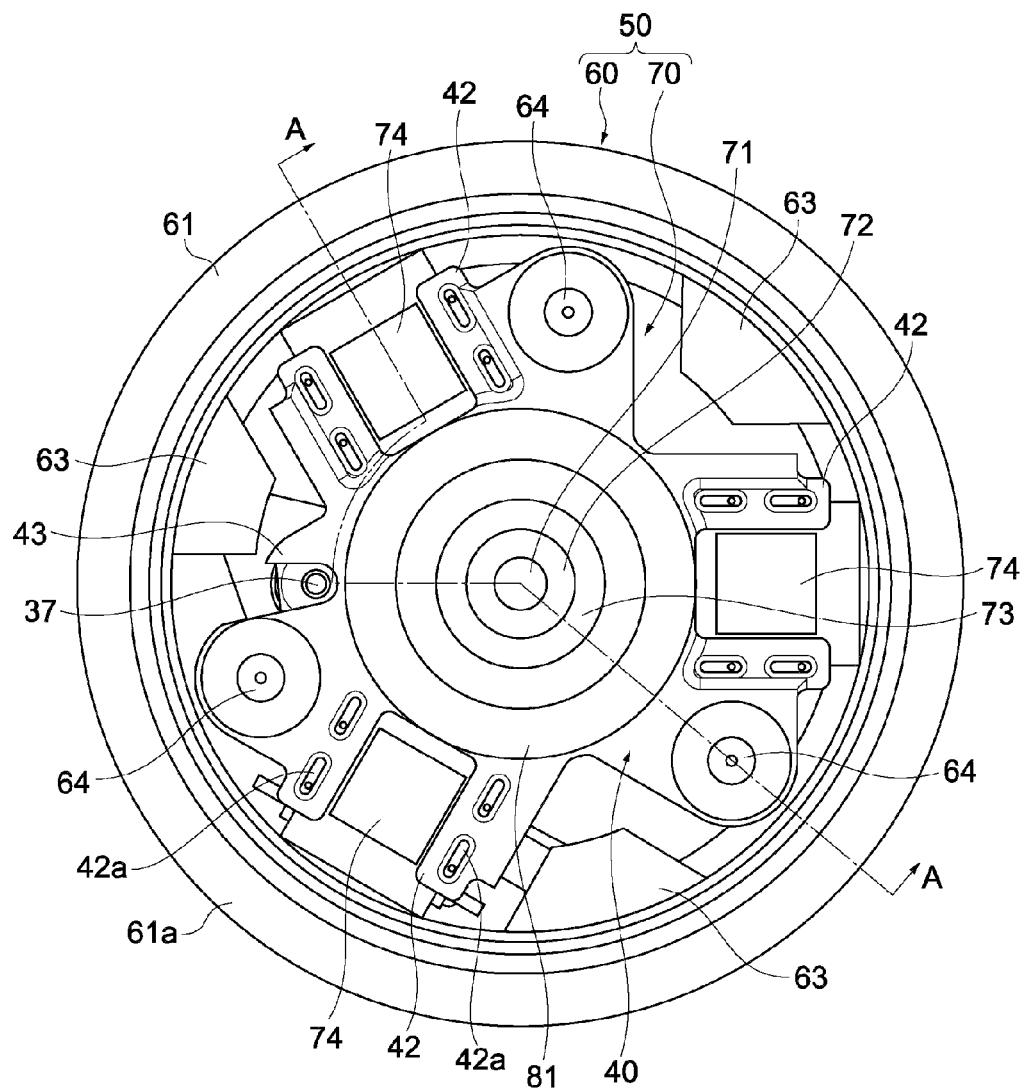
FIG. 4 A plan view showing the drive unit according to the first embodiment.

FIG. 3 is a perspective view showing the drive unit 50 and FIG. 4 is a plan view thereof. The drive unit 50 includes a actuator 70 and a frame 60 installing the actuator 70.

Figure 5:
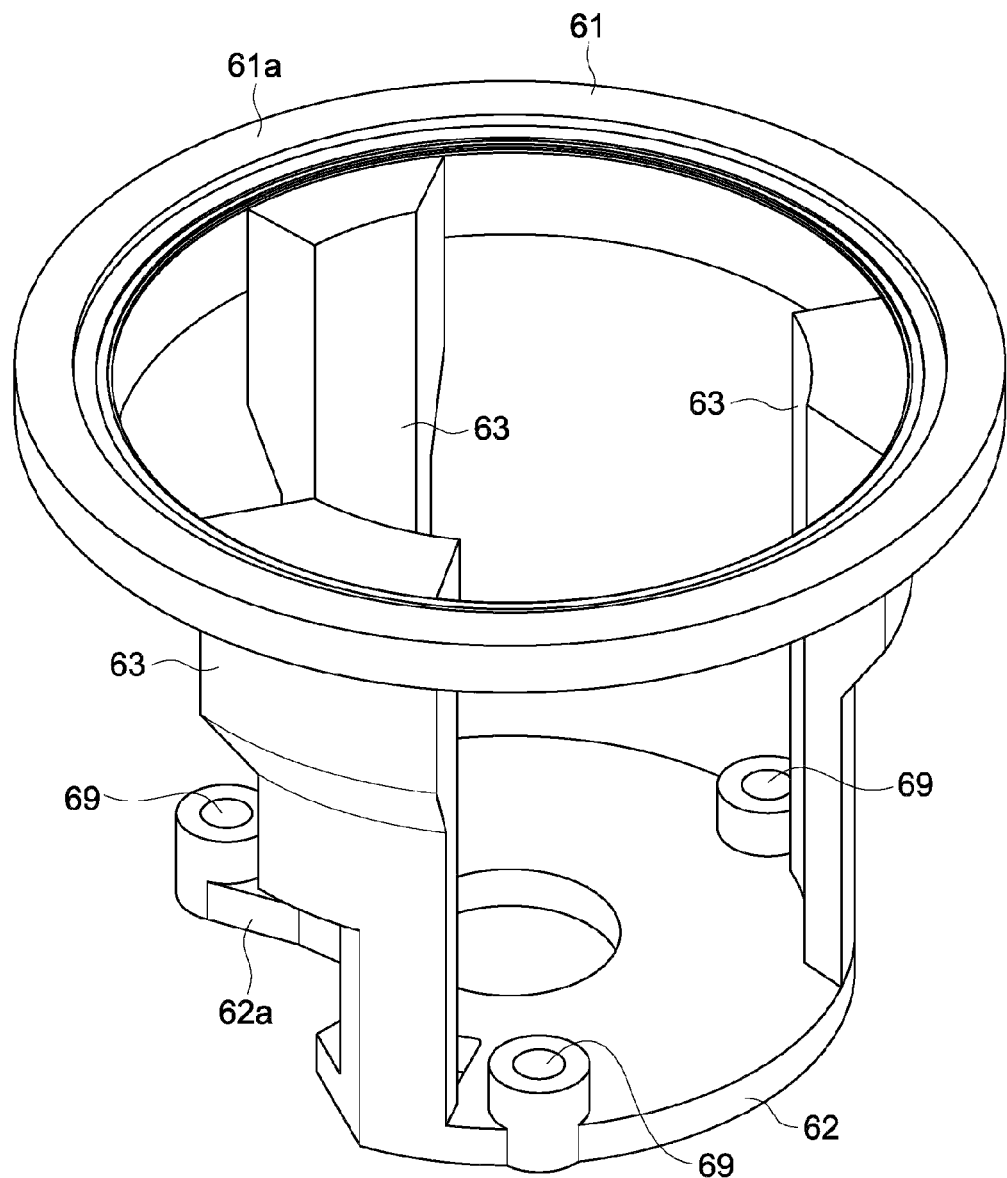
FIG. 5 A perspective view showing a frame of the drive unit according to the first embodiment.
Figure 6:
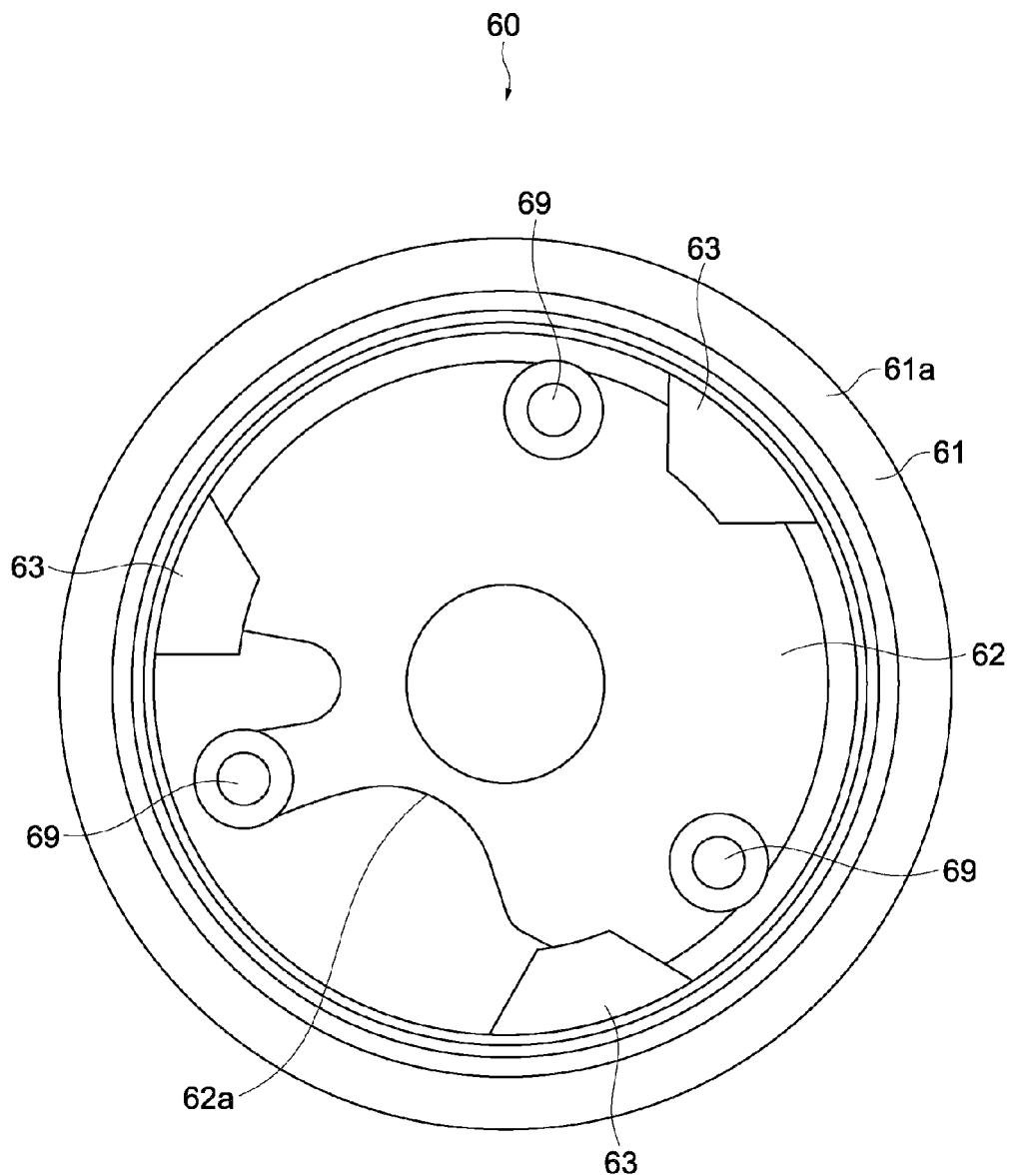
FIG. 6 A plan view showing the frame according to the first embodiment.

FIG. 5 is a perspective view showing the frame 60 and FIG. 6 is a plan view thereof. The frame 60 is made of metal material such as iron and steel, aluminum, or magnesium and formed by integral molding by casting. The frame 60 includes a connecting portion 61, a bottom plate portion 62, and a plurality of coupling portions 63. The connecting portion 61 is connectable to a division wall 152 (see FIG. 8) of the conveyance chamber 151 described above. The bottom plate portion 62 is provided to be opposed to the connecting portion 61 and serves as an opposed portion. The plurality of coupling portions 63 couple the connecting portion 61 and the bottom plate portion 62 to each other.

Figure 8:
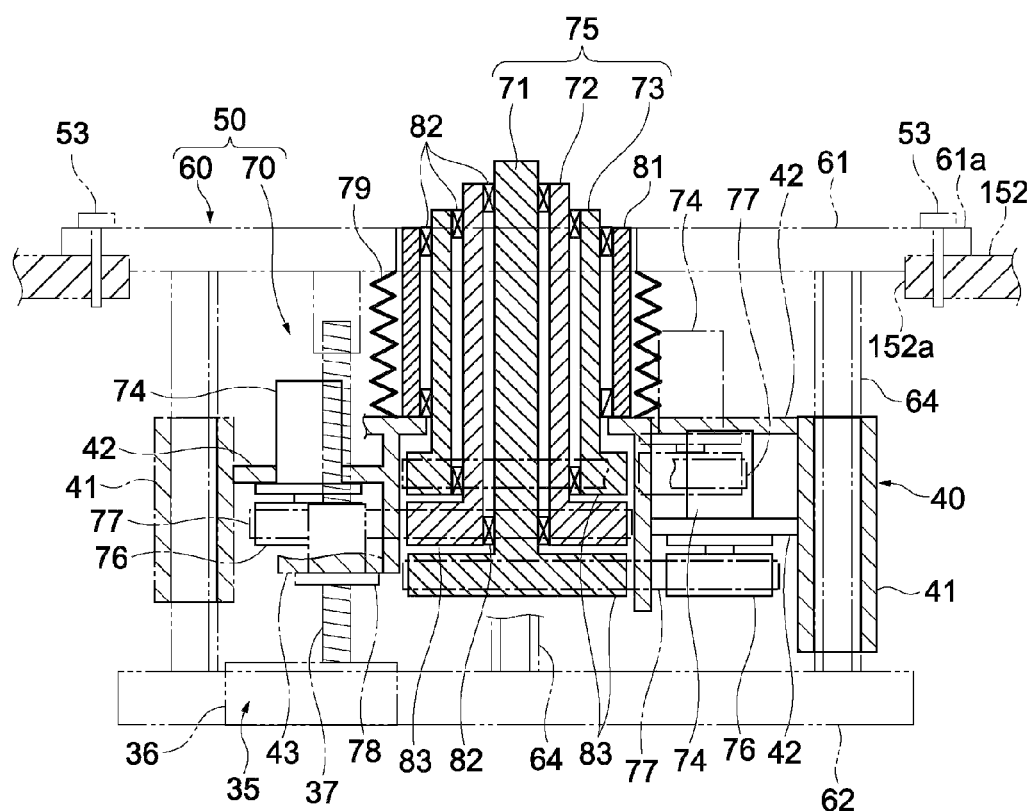
FIG. 8 A schematic cross-sectional view taken along the line A-A of FIG. 4.

The connecting portion 61 is formed in a ring shape and includes a flange 61a. It should be noted that a lid 65 can be attached and detached to/from the connecting portion 61. Although not shown in the figures, the flange 61a is provided with a plurality of holes through which bolts pass. By fixing the flange 61a to an opening portion 152a formed in the division wall 152 with bolts 53 as shown in FIG. 8, the frame 60 is fixed to the division wall 152.

For example, the three coupling portions 63 are provided. The coupling portions 63 are arranged at equiangular intervals, i.e., 120° intervals along a turning direction of the arm unit 30 (in circumference with shafts 75 being center). Further, each of the coupling portions 63 on a side closer to the connecting portion 61 than the bottom plate portion 62 is formed to be wider than on a side of the bottom plate portion 62.

In this embodiment, the frame 60 is formed by the integral molding, and hence it is possible to enhance the rigidity and durability of the frame 60. In particular, it is possible to realize the frame 60 having sufficient resistance to a stress due to a reaction of the actuator 70 during driving of the arm unit 30.

Further, the frame 60 is formed by the integral molding, and hence the number of components can be reduced. Therefore, assembling of the drive unit 50 becomes easy.

The coupling portions 63 are arranged at the equiangular intervals along the turning direction of the arm unit 30, and hence it is possible to evenly distribute a stress added to the coupling portions 63 and the connecting portion 61 especially when the arm unit 30 turns.

The portions of the coupling portions 63 on the side of the connecting portion 61 become portions subjected to a large shear stress of the stress due to the reaction during the driving of the arm unit 30. Each of the coupling portions 63 on the connecting portion 61 side is formed to be wider than on the bottom plate portion 62 side, and hence it is possible to realize the frame 60 rigid enough to endure the stress described above.

Figure 7:
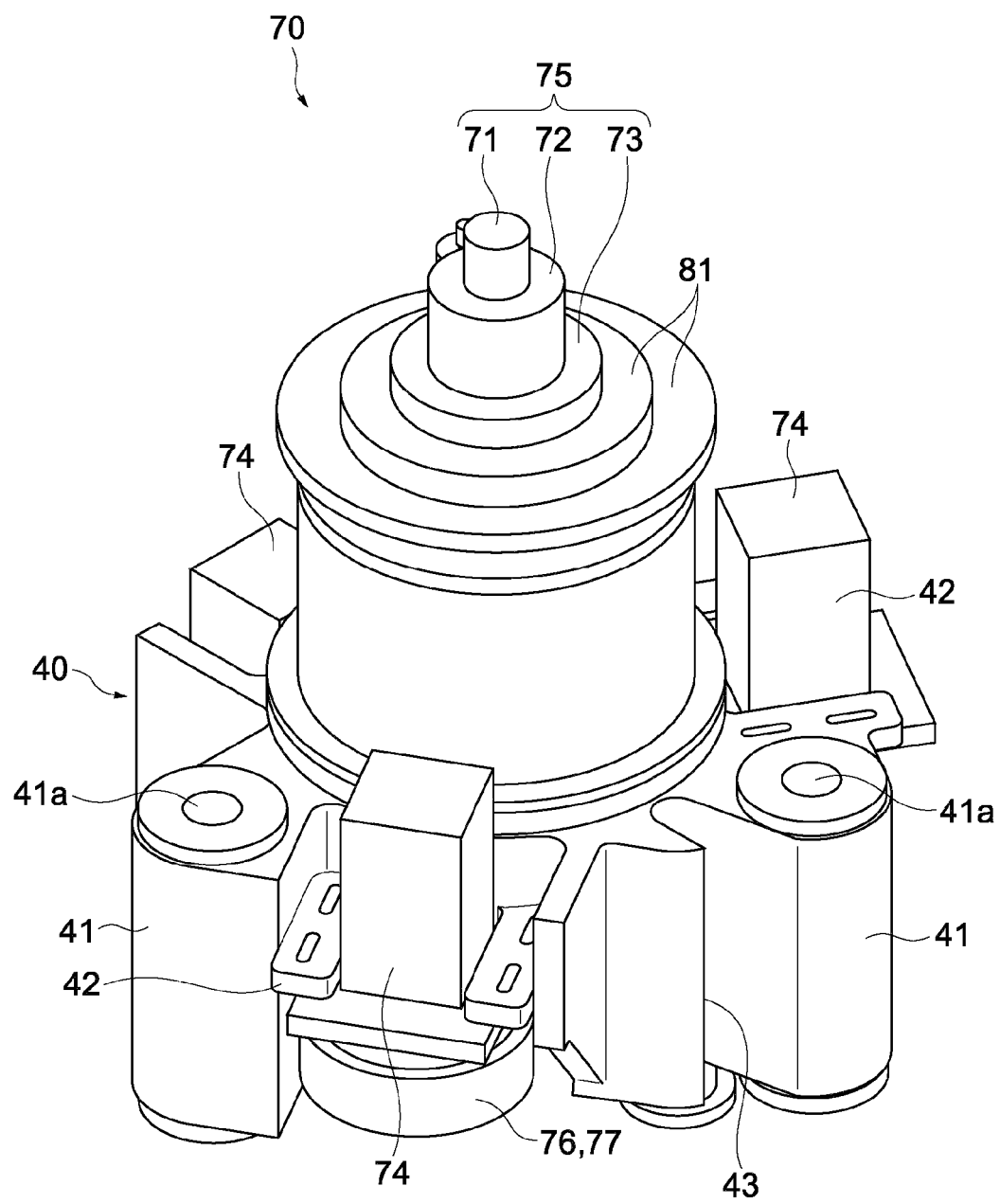
FIG. 7 A perspective view showing an actuator of the drive unit according to the first embodiment.

FIG. 7 is a perspective view showing the actuator 70. FIG. 8 is a schematic cross-sectional view taken along the line A-A of FIG. 4. FIG. 8 shows a state in which the actuator 70 is installed in the frame 60.

The actuator 70 includes the three coaxial shafts 75 (two rotating shafts 71 and 72 and single turning shaft 73), three motors 74, and a transmission mechanism. The transmission mechanism transmits a rotational driving force generated by the three motors 74 to the three shafts 75. The turning shaft 73 and the rotating shaft 72 are each formed to have a hollow shape. Into the turning shaft 73, the rotating shaft 72 having a smaller diameter than that of the turning shaft 73 is provided. Into the rotating shaft 72, the rotating shaft 71 having a smaller than that of the rotating shaft 72 is, in turn, provided. As shown in FIG. 8, the transmission mechanism typically includes driving pulleys 76, driven pulleys 83, and belts 77. Each of the driving pulleys 76 is connected to each of the motors 74. Each of the driven pulleys 83 is provided to each of the shafts 71, 72, and 73. Each of the belts 77 is bridged between the driving pulley 76 and the driven pulley 83.

Figure 9:
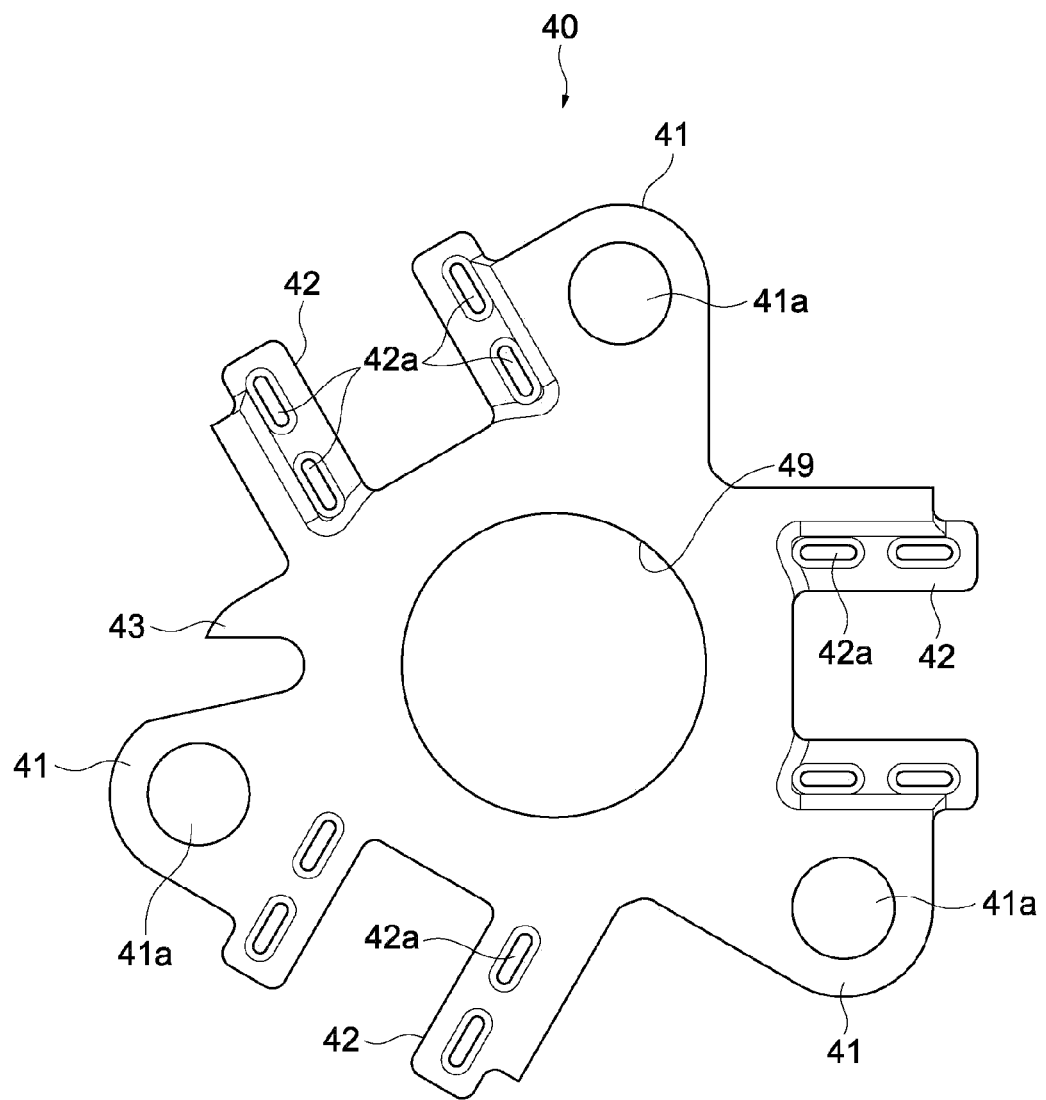
FIG. 9 A plan view showing a support base according to the first embodiment.
Figure 10:
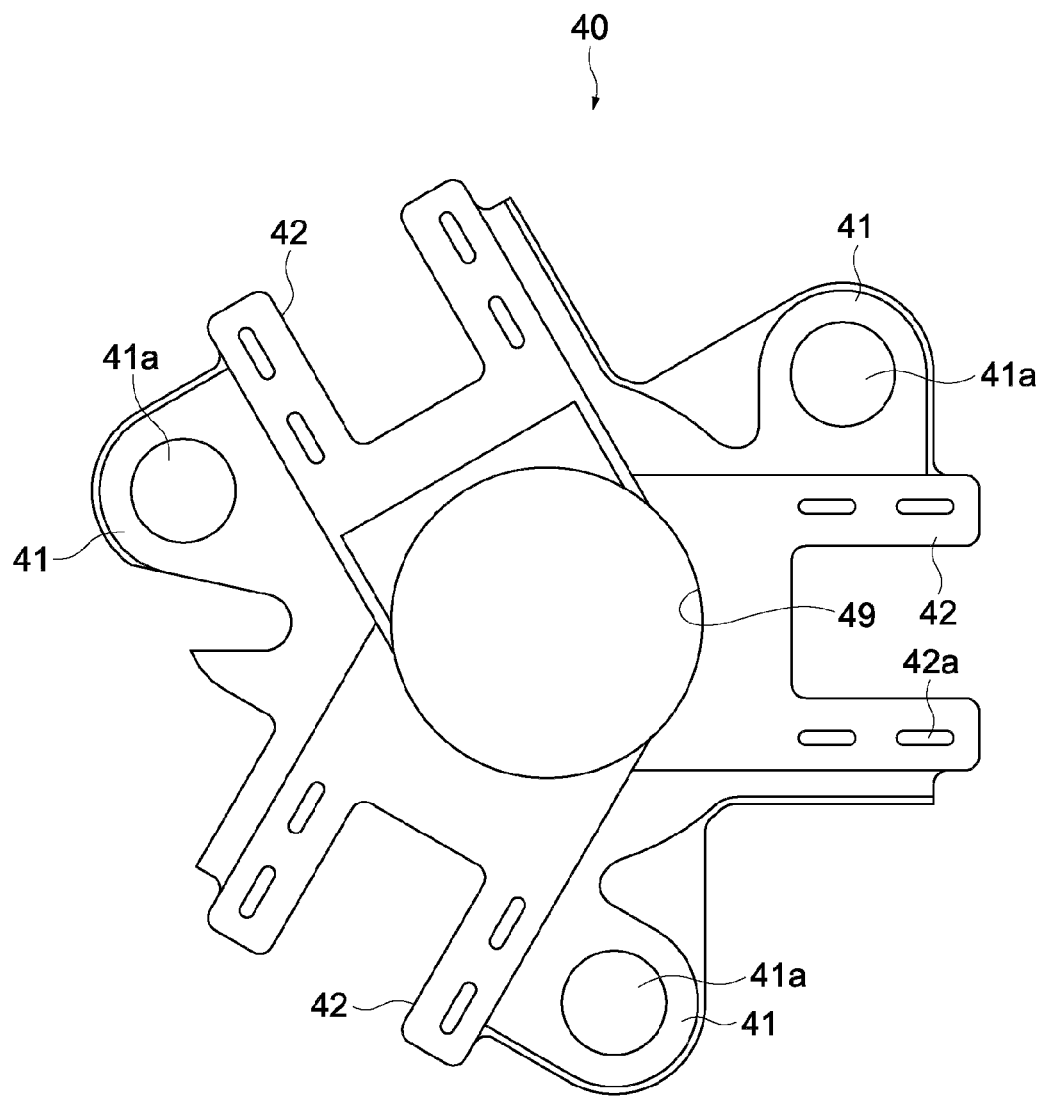
FIG. 10 A bottom view showing the support base according to the first embodiment.

The actuator 70 includes a support base 40 that supports the three shafts 75, the motors 74, and the like. FIG. 9 is a plan view showing the support base 40. FIG. 10 is a bottom view showing the support base 40. The support base 40 is formed by integral molding by casting.

At substantially the center of the support base 40, an opening 49 through which the three shafts 75 pass is formed. Further, as shown in FIGS. 9 and 10, the support base 40 includes motor-mounting portions 42 arranged around the opening 49 at equiangular intervals along a rotation direction of the three shafts 75 (the turning direction of the arm unit 30). The motor-mounting portions 42 are provided to be different in height from each other depending on the height positions of the driven pulleys 83 of the shafts 71, 72, and 73. Therefore, the motors 74 are provided in different heights. The motor-mounting portions 42 are provided with screw holes 42a. The motors 74 are fixed on the support base 40 with screws.

Between the rotating shaft 71 and the rotating shaft 72 and between the rotating shaft 72 and the turning shaft 73, there are provided vacuum-sealed bearings 82. Also, between the turning shaft 73 and an outer tube 81 uprightly provided on the support base 40, vacuum-sealed bearings 82 are further provided. On an outer peripheral side of the outer tube 81, between the support base 40 and a backside of the connecting portion 61 of the frame 60, a bellows 79 is provided. With this configuration, it becomes possible to maintain the outside of the bellows 79 at atmospheric pressure and the inside of the division wall 152 of the conveyance chamber 151 in a vacuum state.

As shown in FIG. 3, the actuator 70 includes a raising and lowering mechanism 35 (not shown in FIG. 7) that drives the support base 40 to move up and down. The raising and lowering mechanism 35 includes a raising and lowering drive source unit 36 and a ball screw 37. The raising and lowering drive source unit 36 is mounted to the bottom plate portion 62. The ball screw 37 is provided to extend from the raising and lowering drive source unit 36 and driven to rotate by the raising and lowering drive source unit 36. A drive mechanism for driving the ball screw 37 of the raising and lowering source unit 36 is, although not shown in the figures, constituted of a raising and lowering motor, a belt, pulleys (partially shown in the figures), and the like.

The raising and lowering drive source unit 36 is fixed with a bolt or the like in a cutout portion 62a (see FIG. 5) formed in the bottom plate portion 62. As shown in FIGS. 8 to 10, the support base 40 is provided with an insertion portion 43 into which the ball screw 37 is inserted. For example, as shown in FIGS. 3 and 8, in a lower portion of the insertion portion 43, a ball nut 78 is fastened. As described above, by providing the cutout portion 62a and then providing the raising and lowering drive source unit 36 to the cutout portion 62a, it is possible to realize downsizing of the drive unit 50. Further, it is possible to easily mount the raising and lowering drive source unit 36 to the frame 60 and the actuator 70.

The support base 40 includes a plurality of guide portions 41 arranged at equiangular intervals along the rotation direction of the shafts 71, 72, and 73. Each of the guide portions 41 includes a hole 41a, into which a raising and lowering guide shaft 64 (see FIGS. 3 and 8 and the like) is inserted, and a bearing (bush) that supports the raising and lowering guide shaft 64. Smooth raising and lowering operations by the raising and lowering guide shafts 64 are thus ensured. The raising and lowering guide shafts 64 are mounted and fixed to mounting portions 69. Each of the mounting portions 69 is provided to the bottom plate portion 62 of the frame 60 shown in FIG. 5 and has a hole shape. For example, the three raising and lowering guide shafts 64 are provided and arranged at 120° intervals along the rotation direction of the shafts 71, 72, and 73. When the ball screw 37 of the raising and lowering mechanism 35 rotates, the ball nut 78 receives the rotational power. Then, the support base 40 moves up and down while being guided by the raising and lowering guide shafts 64 in the guide portions 41. When the support base 40 moves up and down, the turning block 8 and both the arm units 30 move up and down.

As discussed above, in this embodiment, in the actuator 70, the shafts and the motors 74 are integrated by the support base 40. Thus, by a user assembling the thus integrated actuator 70 to the frame 60 in such a manner that the actuator 70 is inserted from a side of the connecting portion 61 into the frame 60, it is possible to easily assemble the drive unit 50. Further, even after the actuator 70 is assembled to the frame 60, it is possible to easily assemble the raising and lowering drive source unit 36 to the frame 60 and the actuator 70.

In this embodiment, the motors 74 are arranged at equiangular intervals, and hence it is possible to evenly distribute a stress added to the frame 60 via the motors 74 during turning of the arm units 30. Further, the raising and lowering guide shafts 64 are also arranged at equiangular intervals, and hence it is possible to evenly distribute a stress added to the guide shafts 64 and a stress added to the frame 60 via the guide shafts 64.

Figure 11:
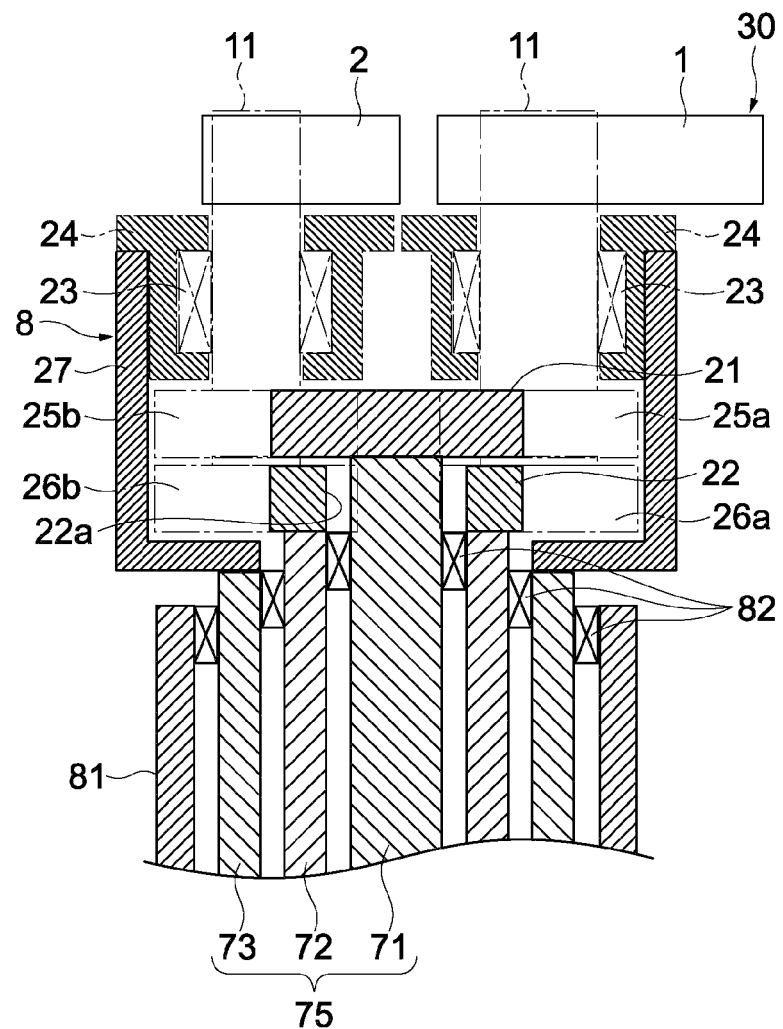
FIG. 11 A schematic cross-sectional view showing an inner structure of a turning block according to the first embodiment.
Figure 12:
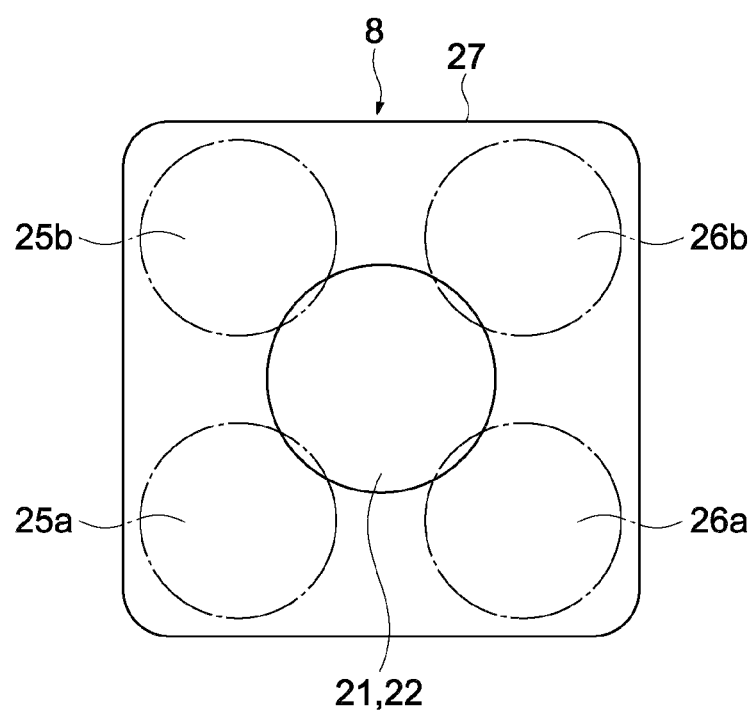
FIG. 12 A plan view showing engagement states of gears in the turning block according to the first embodiment.

FIG. 11 is a schematic cross-sectional view showing an inner structure of the turning block 8. FIG. 12 is a plan view showing engagement states of gears within the turning block 8.

The turning block 8 includes a case 27 fixed to the turning shaft 73. Within the case 27, a gear 21 is fixed to the rotating shaft 71 and a gear 22 is fixed to the rotating shaft 72. At the center of the gear 22, there is formed a hole through which the rotating shaft 71 passes. The gears 21 and 22 are coaxially arranged.

To the first joint shafts 11 connected to the first arm 1 and the second arm 2 of the one arm unit 30, gears 25a and 25b that mesh with the gear 21 are fixed, respectively. The gears 25a and 25b are arranged side by side in a horizontal plane.

Further, similarly, to the first joint shafts 11 connected to the first arm 1 and the second arm 2 of the other arm unit 30, gears 26a and 26b that mesh the gear 22 are fixed, respectively. The gears 26a and 26b are arranged side by side in a horizontal plane.

As shown in FIG. 11, the plane in which the gears 25a and 25b are arranged side by side is different in height from the plane in which the gears 26a and 26b are arranged side by side. It should be noted that, for easy understanding of FIG. 11, the first joint shaft 11s of the one arm unit 30 are shown and the first joint shafts 11 of the other arm unit 30 are not shown in the figures. Within the turning block 8, each of the first joint shafts 11 is housed in a tubular case 24 via a bearing 23. The cases 24 are fixed to the case 27 of the turning block 8.

With this configuration, the drive unit 50 can be driven to extend and retract using the coaxial rotating shafts 71 and 72 with the arm units 30 being independent of each other, and can turn both the arm units 30 using the turning shaft 73 coaxial with the rotating shafts 71 and 72. It should be noted that when the turning block 8 turns using the turning shaft 73, the driving shafts 11 rotate relative to the respective cases 37 due to an inertial force, and hence the rotating shafts 71 and 72 may be driven so as to suppress such rotation. Alternatively, the rotating shafts 71 and 72 may be driven in synchronization with the driving of the turning shaft 73 to rotate.

<Second Embodiment>

Figure 13:
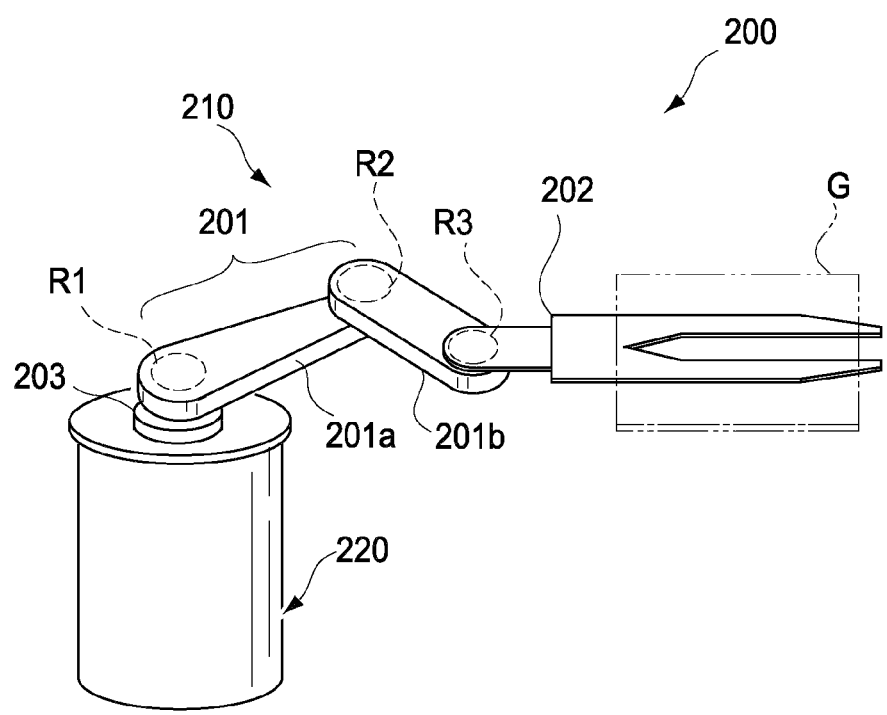
FIG. 13 A perspective view showing a conveyance device according to the second embodiment of the present invention.

FIG. 13 is a perspective view schematically showing a conveyance device according to a second embodiment of the present invention. A conveyance device 200 according to this embodiment includes an arm unit 210 and a drive unit 220 (drive device). The arm unit 210 serves as the conveyance body. The drive unit 220 drives the arm unit 210 to turn, extend/retract, and move up/down.

The arm unit 210 includes a multijoint arm 201, a hand member 202 formed at a distal end of the multijoint arm 201, and a turning block 203 that supports the multijoint arm 201. The multijoint arm 201 is constituted of a coupling body of a first arm 201a and a second arm 201b. One end of the first arm 201a is connected to the turning block 203. The other end of the first arm 201a is rotatably connected to one end of the second arm 202 via a rotational shaft R2. The other end of the second arm 201b is rotatably connected to the hand member 202 via a rotational shaft R3.

The arm unit 210 thus configured constitutes a so-called SCARA (Selective Compliance Assembly Robot Arm) type substrate-conveying robot. As will be described later, the drive unit 220 includes a turning shaft 273 and a rotating shaft 271. The turning shaft 273 is connected to the turning block 203 and turns the arm unit 210 in a horizontal plane in cooperation with the turning block 203. The rotating shaft 271 is connected to a rotational shaft R1, the rotational shaft R1 being mounted to the end of the first arm 201a so as to penetrate the turning block 203. The rotational shaft R1 and the rotational shaft R2 are coupled to each other via a first timing belt (omitted in the figures). The rotational shaft R2 and the rotational shaft R3 are coupled to each other via a second timing belt (omitted in the figures). Thus, in the rotation direction of the rotating shaft described above, the multijoint arm 201 is driven to extend and retract.

Next, a configuration of the drive unit 220 will be described later.

Figure 14:
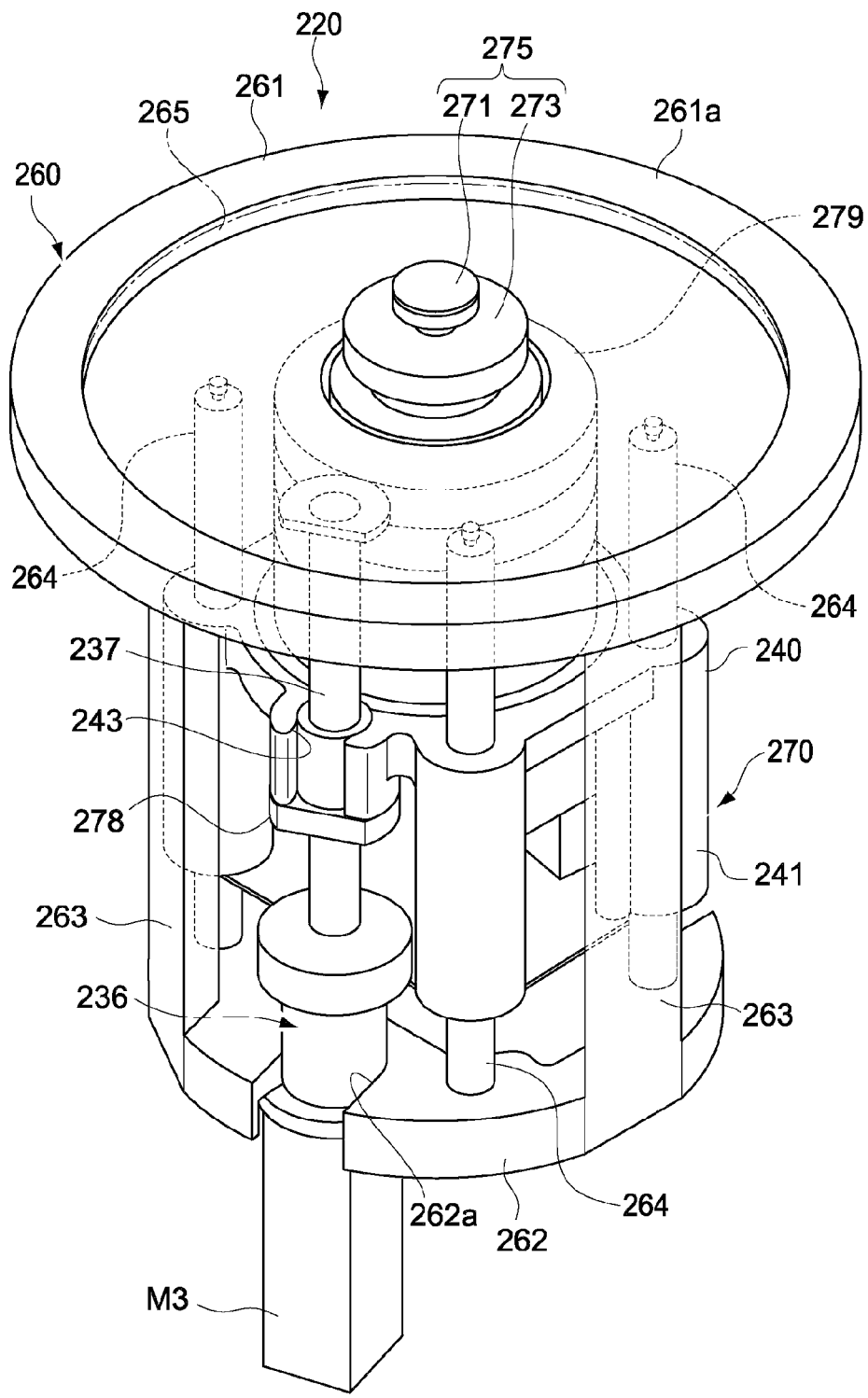
FIG. 14 A perspective view showing a drive unit of the conveyance device according to the second embodiment.
Figure 15:
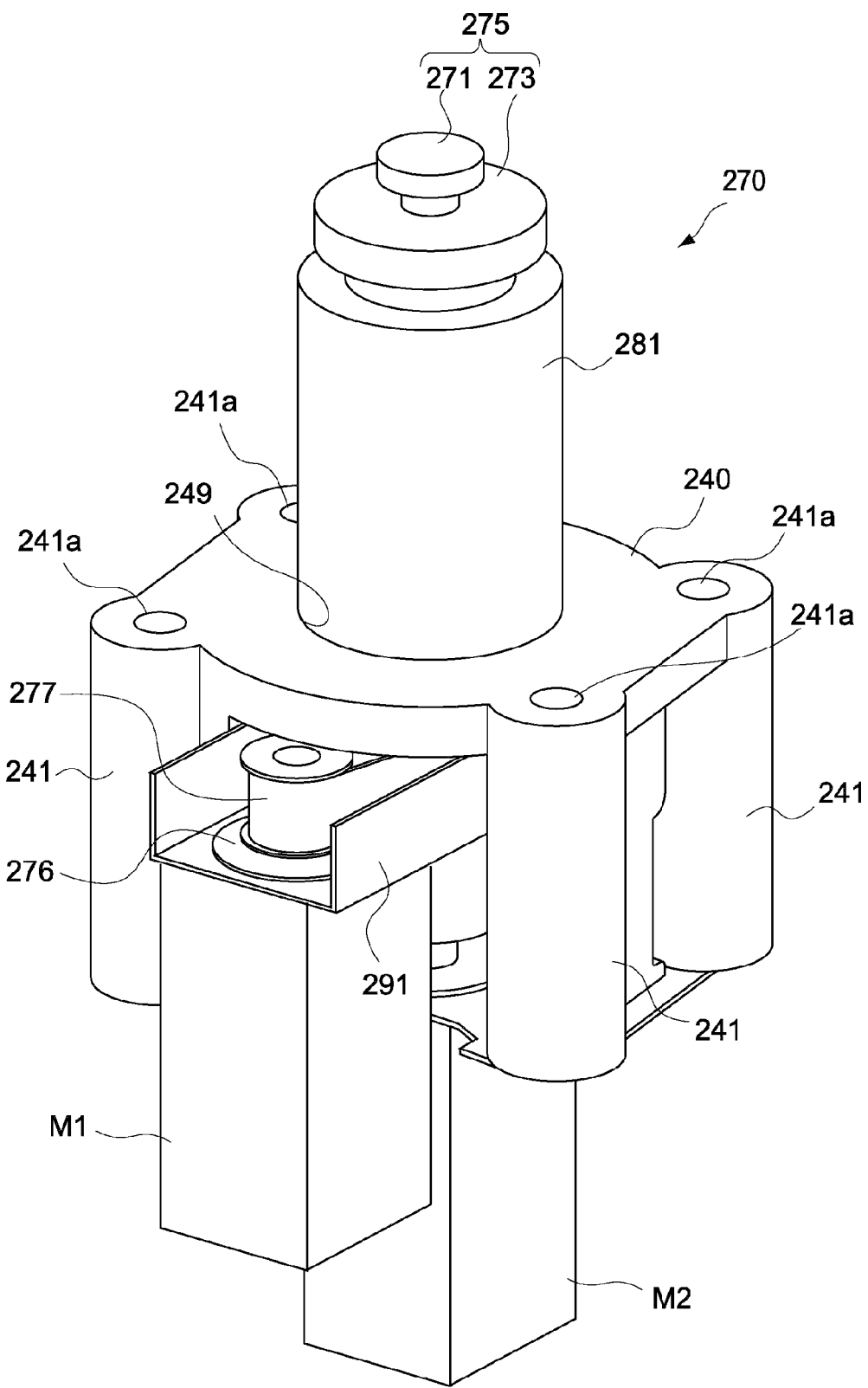
FIG. 15 A perspective view showing an actuator of the drive unit according to the second embodiment.
Figure 16:
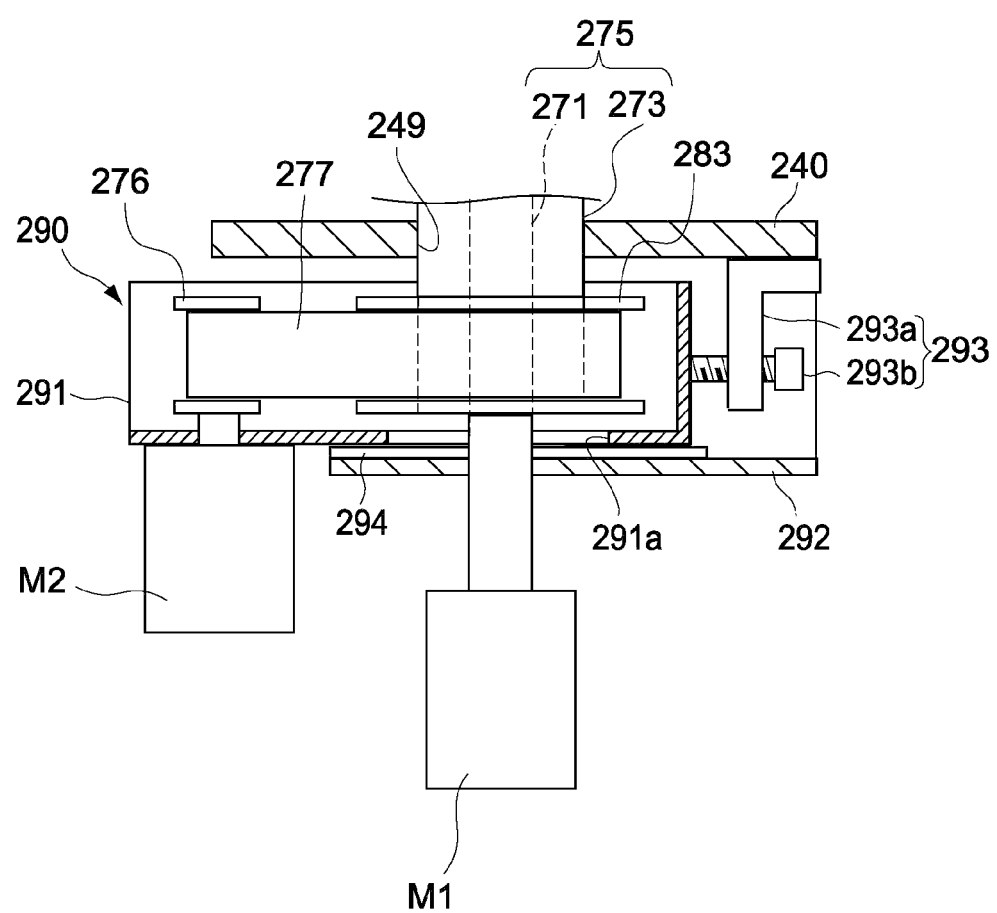
FIG. 16 A cross-sectional view of the main parts of the actuator according to the second embodiment.
Figure 17:
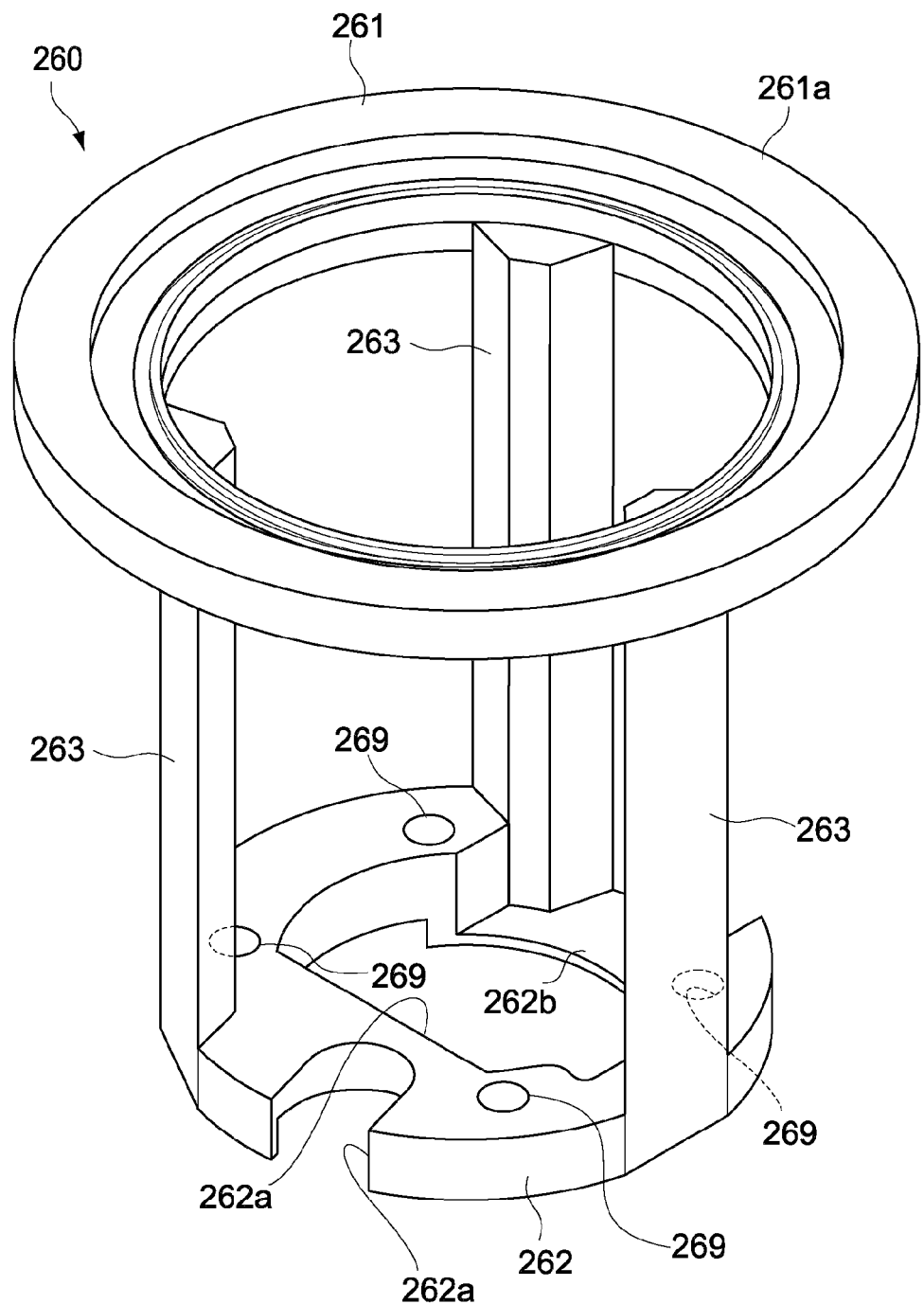
FIG. 17 A perspective view showing a frame of the drive unit according to the second embodiment.

FIG. 14 is a perspective view of the drive unit 220. The drive unit 220 includes an actuator 270 and a frame 260 installing the actuator 270. FIG. 15 is a perspective view of the actuator 270 and FIG. 16 is a cross-sectional view of main parts of the actuator 270. FIG. 17 is a perspective view of the frame 260.

The frame 260 is made of metal material such as iron and steel, aluminum, or magnesium and formed by integral molding by casting. The frame 260 includes a connecting portion 261, a bottom plate portion 262, and a plurality of coupling portions 263. The connecting portion 261 is connectable to a division wall of a conveyance chamber (see FIG. 8). The bottom plate portion 262 is provided to be opposed to the connecting portion 261 and serves as the opposed portion. The plurality of coupling portions 263 couple the connecting portion 261 and the bottom plate portion 262 to each other.

The connecting portion 261 is formed in a ring shape and includes a flange 261a. It should be noted that a lid 265 can be attached and detached to/from the connecting portion 261. Although not shown in the figures, the flange 261a is provided with a plurality of holes through which bolts pass. By fixing the flange 261a to an opening portion formed in the above-mentioned division wall with a plurality of bolts, the frame 260 is fixed to the division wall. For example, the three coupling portions 263 are provided. The coupling portions 263 are arranged at equiangular intervals, i.e., 120° intervals along a turning direction of the arm unit 210.

In this embodiment, the frame 260 is formed by the integral molding, and hence it is possible to enhance the rigidity and durability of the frame 260. In particular, it is possible to realize the frame 260 having sufficient resistance to a stress due to a reaction of the actuator 270 during driving of the arm unit 210.

Further, the frame 260 is formed by the integral molding, and hence the number of components can be reduced. Therefore, assembling of the drive unit 220 becomes easy.

The coupling portions 263 are arranged at the equiangular intervals along the turning direction of the arm unit 210, and hence it is possible to evenly distribute a stress added to the coupling portions 263 and the connecting portion 261 especially when the arm unit 210 turns.

The actuator 270 includes two coaxial shafts (single rotating shaft 271 and single turning shaft 273) and two motors M1 and M2. The motor M1 is connected to a lower end of the rotating shaft 271 and rotates the rotating shaft 271. The motor M1 passes through an opening 262a (FIG. 17) formed at the center of the bottom plate portion 262 of the frame 260. The motor M2 rotates the turning shaft 273 via a rotation transmission mechanism. In order to prevent interference of the motor M2 and the bottom plate portion 262, the bottom plate portion 262 is provided with a thin-wall portion 262b (FIG. 17).

The turning shaft 273 is formed to have a hollow shape. Into the turning shaft 273, the rotating shaft 271 is provided having a smaller diameter than that of the turning shaft 273. As shown in FIGS. 15 and 16, the transmission mechanism typically includes a driving pulley 276, a driven pulley 283, and a belt 277. The driving pulley 276 is connected to the motor M1. The driven pulley 283 is provided to the turning shaft 273. The belt 277 is bridged between the driving pulley 276 and the driven pulley 283.

The actuator 270 includes a support base 240 that supports the two shafts 275, the motors M1 and M2, and the like. The support base 240 is made of, for example, the metal material same as the frame 260 and formed by integral molding by casting.

At substantially the center of the support base 240, an opening 249 through which the two shafts 275 pass is formed. The transmission mechanism is provided directly beneath the opening 249 of the support base 240. As shown in FIG. 16, the transmission mechanism includes an adjustment unit 290 for adjusting the tension of the belt 277. The adjustment unit 290 includes a movable body 291, a fixing plate 292, and an adjustment portion 293. The movable body 291 supports the motor M2. The fixing plate 292 is fixed on the support base 240 and supports the movable body 291. The adjustment portion 293 is capable of moving the movable body 291 with respect to the fixing plate 292.

The adjustment unit 290 includes a bracket 293a and a bolt member 293b. The bracket 293a is fixed on the support base 240. The bolt member 293b has a distal end to be screwed into the bracket 293a and abut against the movable body 291. The driving shaft of the motor M1 passes through a long hole 291a and is coupled to the rotating shaft 271, the long hole 291a being formed in a bottom surface of the movable body 291. Between the movable body 291 and the fixing plate 292, there is provided a linear guide rail 294. The adjustment unit 290 moves the movable body 291 relative to the fixing plate 292 in directions in which the driving pulley 276 and the driven pulley 283 move away from/closer to each other by a rotation operation of the bolt member 293b. Thus, it is possible to prevent the actuator 270 from increasing in size and realize the adjustment mechanism using the belt tension.

Between the rotating shaft 271 and the turning shaft 273, vacuum-sealed bearings are provided. Also, between the turning shaft 273 and an outer tube 281 uprightly provided on the support base 240, vacuum-sealed bearings are further provided. As shown in FIG. 14, on an outer peripheral side of the outer tube 281, between the support base 240 and a lid 265 provided to the connecting portion 261 of the frame 260, a bellows 279 is provided. With this configuration, it becomes possible to maintain the outside of the bellows 279 at atmospheric pressure and the inside of the division wall of the conveyance chamber in a vacuum state.

The actuator 270 includes a raising and lowering mechanism 236 that drives the support base 240 to move up and down with respect to the frame 260. The raising and lowering mechanism 236 includes a motor M3 and a ball screw 237. The motor M3 is mounted to the bottom plate portion 262. The ball screw 237 is driven to rotate by the motor M3. An upper end portion of the ball screw 237 is rotatably supported by a back surface of the lid 265.

The motor M3 is fixed to a cutout portion 262a (see FIGS. 14 and 17) formed in the bottom plate portion 262 with bolts or the like. As shown in FIG. 14, the support base 240 is provided with an insertion portion 243 into which the ball screw 237 is inserted. In a lower portion of the insertion portion 243, a ball nut 278 is fastened. As described above, by providing the cutout portion 262a and then providing the motor M3 to the cutout portion 262a, it is possible to realize downsizing of the drive unit 220. Further, it is possible to easily mount the raising and lowering mechanism 236 to the frame 260 and the actuator 270.

The support base 240 includes a plurality of guide portions 241 arranged at equiangular intervals along the rotation direction of the shafts 271 and 273. Each of the guide portions 241 includes a hole 241a, into which a raising and lowering guide shaft 264 (see FIG. 14) is inserted, and a bearing (bush) that supports the raising and lowering guide shaft 264. Smooth raising and lowering operations of the support base 40 by the raising and lowering guide shafts 264 are thus ensured. An upper end portion of each of the raising and lowering guide shafts 264 is fixed to the lid 265. A lower end portion of each of the raising and lowering guide shafts 264 is mounted and fixed to a mounting portion 269, the mounting portion 269 being provided to the bottom plate portion 262 of the frame 260 and having a hole shape. For example, the four raising and lowering guide shafts 264 are provided and arranged at 90° intervals along the rotation direction of the shafts 271 and 273. When the ball screw 237 of the raising and lowering mechanism 236 rotates, the ball nut 278 receives the rotational power. Then, the support base 240 moves up and down while being guided by the raising and lowering guide shafts 264 in the guide portions 241. When the support base 240 moves up and down, the turning block 203 and the arm unit 210 move up and down.

As discussed above, in this embodiment, in the actuator 270, the shafts 275 and the motors M1 and M2 are integrated by the support base 240. Thus, by the user assembling the thus integrated actuator 70 to the frame 260 in such a manner that the actuator 270 is inserted from a side of the connecting portion 261 into the frame 260, it is possible to easily assemble the drive unit 220. Further, even after the actuator 270 is assembled to the frame 260, it is possible to easily assemble the raising and lowering mechanism 236 to the frame 260 and the actuator 270.

In this embodiment, the raising and lowering guide shafts 264 are also arranged at equiangular intervals, and hence it is possible to evenly distribute a stress added to the guide shafts 264 and a stress added to the frame 260 via the guide shafts 264.

With this configuration, the drive unit 220 is capable of driving the arm unit 210 to extend and retract using the rotating shaft 271 and turning the arm unit 210 using the turning shaft 273.

Embodiments according to the present invention are not limited to the above-mentioned embodiments and various other embodiments can be conceived.

Although in each of the above-mentioned embodiments, the glass substrate G has been exemplified as the substrate, the substrate for a semi-conductor wafer may be applied. The conveyance object is not limited to the substrate and various components and products, etc. may be applied.

Although in FIG. 2, the conveyance device 100 is used within a vacuum chamber, the conveyance device 100 may be used at atmospheric pressure.

In each of the above-mentioned embodiments, as the mechanism for rotationally driving the shafts 71, 72, and 73 of the actuator 70, the belt drive mechanism has been exemplified. However, in place of the belt drive mechanism, a gear drive mechanism may be used. Alternatively, an embodiment in which a rotational axis of each rotating shaft corresponds to a rotational axis of each motor that rotates the rotating shaft, that is, the motor is directly connected to the shaft may be adopted.

In each of the above-mentioned embodiments, as the conveyance body that conveys the conveyance object, the multi-joint-type arm unit (arm robot) has been exemplified. However, alternatively, a linearly moving-type slider unit (slider type robot) may be applied. In this case, for example, a single turning shaft is connected to the slider unit so that the slider unit is driven to turn. Also, regarding such a slider unit, a plurality of slider units may be provided, for example, two slider units at upper and lower stages. It should be noted that the hand member that holds the conveyance object of this slider unit only needs to be driven by a well-known drive mechanism included in the slider unit itself, such as a belt drive mechanism, linear motor drive mechanism, a rack-and-pinion drive mechanism, or a ball screw drive mechanism.

DESCRIPTION OF REFERENCE SYMBOLS

G substrate
30, 210 arm unit
35, 236 raising and lowering mechanism
36 raising and lowering drive source unit
40, 240 support base
41, 241 guide portion
41a, 241a hole
50, 220 drive unit
60, 260 frame
61, 261 connecting portion
62, 262 bottom plate portion
62a, 262a cutout portion
63, 263 coupling portion
64, 264 raising and lowering guide shaft
70, 270 actuator
71, 271 rotating shaft
72 rotating shaft
73, 273 turning shaft
74, M1, M2, M3 motor
100, 200 conveyance device
151 conveyance chamber
152 division wall

The invention claimed is:

1. A drive device that drives a conveyance body, the conveyance body being provided within a chamber including a division wall and capable of conveying a conveyance object, the drive device comprising:
a frame formed by integral molding, the frame including:
a connecting portion connected to the division wall of the chamber, the connecting portion being formed in a ring shape and including a flange;
an opposed portion provided to be opposed to the connecting portion;
a plurality of coupling portions that couple the connecting portion and the opposed portion to each other, the plurality of coupling portions being arranged at equiangular intervals along a circumferential direction of the flange; and
mounting portions provided on the opposed portion, the mounting portions being arranged between the plurality of coupling portions at equiangular intervals:, and an actuator including:
a turn shaft connected to the conveyance body for turning the conveyance body;
a motor that provides the turn shaft with a rotational driving force;
a support base that supports the turn shaft and the motor, the support base being provided between the connecting portion and the opposed portion;
a raising and lowering motor for raising and lowering the support base along a direction in which the turn shaft extends between the connecting portion and the opposed portion; and
a plurality of guide pillars arranged at equiangular intervals along a direction in which the turn shaft rotates and fixed between the connecting portion and the mounting portions to guide raising and lowering operations of the support base by the raising and lowering motor.

2. The drive device according to claim 1, wherein the conveyance body is a multijoint-type arm unit, and
the actuator further includes an extension and retraction shaft for extending and retracting an arm of the arm unit.

3. The drive device according to claim 1, wherein the opposed portion includes a cutout portion, and the raising and lowering motor is provided to the cutout portion.

4. The drive device according to claim 1, wherein the conveyance body is a multijoint-type arm unit and includes a plurality of conveyance bodies, and the actuator includes
a first rotating shaft connected to a first arm unit of the plurality of arm units for extending and retracting an arm of the first arm unit,
a second rotating shaft connected to a second arm unit of the plurality of arm units for extending and retracting an arm of the second arm unit,
a turning shaft for integrally turning the first arm unit and the second arm unit,
motors that each drive the first rotating shaft, the second rotating shaft, and the turning shaft.

5. The drive device according to claim 4, wherein the motors are arranged at equiangular intervals along a direction in which the first arm unit and the second arm unit turn.

6. The drive device according to claim 1, wherein the support base includes a plurality of guide portions that each support the plurality of guide pillars.

7. The drive device according to claim 1, wherein the conveyance body is a single multijoint-type arm unit, and the actuator includes
a rotating shaft connected to the arm unit for extending and retracting an arm of the arm unit,
a turning shaft for turning the arm unit, and
motors that each drive the rotating shaft and the turning shaft.

8. A conveyance device, comprising:
a conveyance body provided in a chamber including a division wall and capable of conveying a conveyance object;
a frame formed by integral molding, the frame including:
a connecting portion connected to the division wall of the chamber, the connecting portion being formed in a ring shape and including a flange;
an opposed portion provided to be opposed to the connecting portion;
a plurality of coupling portions that couple the connecting portion and the opposed portion to each other, the plurality of coupling portions being arranged at equiangular intervals along a circumferential direction of the flange; and mounting portions provided on the opposed portion, the mounting portions being arranged between the plurality of coupling portions at equiangular intervals; and an actuator including:
- a turn shaft connected to the conveyance body for turning the conveyance body;
- a motor that provides the turn shaft with a rotational driving force;
- a support base that supports the turn shaft and the motor, the support base being provided between the connecting portion and the opposed portion;
- a raising and lowering motor for raising and lowering the support base along a direction in which the turn shaft extends between the connecting portion and the opposed portion; and
- a plurality of guide pillars arranged at equiangular intervals along a direction in which the turn shaft rotates and fixed between the connecting portion and the mounting portions to guide raising and lowering operations of the support base by the raising and lowering motor.

9. A drive device that drives a conveyance body, the conveyance body being provided within a chamber including a division wall and capable of conveying a conveyance object, the drive device comprising:

an actuator for driving the conveyance body; and
a frame formed by integral molding, connected to the division wall of the chamber, installing the actuator;
wherein the frame includes:
- a connecting portion connected to the division wall of the chamber, the connecting portion being formed in a ring shape and including a flange;
- an opposed portion provided to be opposed to the connecting portion; and
- a plurality of coupling portions that couple the connecting portion and the opposed portion to each other, the plurality of coupling portions being arranged at equiangular intervals along a circumferential direction of the flange; and
- mounting portions provided on the opposed portion, the mounting portions being arranged between the plurality of coupling portions at equiangular intervals;

wherein the actuator includes:
- a plurality of shafts connected to the conveyance body for turning, extending and retracting the conveyance body, the plurality of shafts being coaxially arranged;
- a plurality of motors that provide the plurality of shafts with a rotational driving force;
- a support base that supports the plurality of shafts and the plurality of motors, the support base being provided between the connecting portion and the opposed portion;
- a raising and lowering motor for raising and lowering the support base along a direction in which the plurality of shafts extends between the connecting portion and the opposed portion; and
- a plurality of guide pillars arranged at equiangular intervals along a direction in which the plurality of shafts rotates and fixed between the connecting portion and the mounting portions to guide raising and lowering operations of the support base by the raising and lowering motor, and wherein the support base includes:
- a first opening through which the plurality of shafts pass;
- a plurality of second openings through which the plurality of guide pillars pass; and
- a plurality of motor-mounting portions for mounting the plurality of motors arranged around the opening at equiangular intervals.

* * * * *